(12) United States Patent
Tu et al.

(10) Patent No.: US 6,723,585 B1
(45) Date of Patent: Apr. 20, 2004

(54) LEADLESS PACKAGE

(75) Inventors: Nghia Tu, San Jose, CA (US); Shaw Wei Lee, Cupertino, CA (US); Sadanand R. Patil, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/286,320

(22) Filed: Oct. 31, 2002

(51) Int. Cl.[7] .................. H01L 21/44; H01L 21/48; H01L 21/50
(52) U.S. Cl. .............. 438/123; 438/106; 438/121; 257/666; 257/687; 257/678; 257/701; 257/121; 174/52.2; 174/52.4
(58) Field of Search ................. 438/123, 106, 438/121; 257/666, 678, 687, 701; 174/52.4, 52.2, 250; 361/792

(56) References Cited

U.S. PATENT DOCUMENTS

| | | |
|---|---|---|
| 5,241,456 A | 8/1993 | Marcinkiewicz et al. |
| 5,376,825 A | 12/1994 | Tukamoto et al. |
| 5,798,564 A | 8/1998 | Eng et al. |
| 6,020,629 A | 2/2000 | Farnworth et al. |
| 6,153,928 A | 11/2000 | Cho |
| 6,326,544 B1 | 12/2001 | Lake |
| 6,372,539 B1 * | 4/2002 | Bayan et al. ............. 438/106 |
| 6,381,141 B2 | 4/2002 | Corisis et al. |
| 6,399,415 B1 * | 6/2002 | Bayan et al. ............. 438/106 |
| 6,400,004 B1 * | 6/2002 | Fan et al. .................. 257/666 |
| 6,452,255 B1 * | 9/2002 | Bayan et al. ............. 257/666 |
| 6,524,886 B2 * | 2/2003 | Lee ........................... 438/106 |
| 6,534,855 B1 | 3/2003 | Ahn et al. |
| 6,610,924 B1 * | 8/2003 | Lee et al. ................. 174/52.4 |
| 2002/0164535 A1 * | 11/2002 | Hoffend et al. ........... 430/20 |
| 2002/0177256 A1 * | 11/2002 | Lee ........................... 438/111 |
| 2003/0071333 A1 * | 4/2003 | Matsuzawa .............. 257/676 |
| 2003/0071344 A1 * | 4/2003 | Matsuzawa et al. ..... 257/692 |
| 2003/0082854 A1 * | 5/2003 | Kasahara et al. ......... 438/123 |

FOREIGN PATENT DOCUMENTS

| | | | | |
|---|---|---|---|---|
| JP | 2002093982 A | * | 3/2002 | ........... H01L/23/50 |

* cited by examiner

Primary Examiner—Matthew Smith
Assistant Examiner—Betur Keshavan
(74) Attorney, Agent, or Firm—Beyer Weaver & Thomas LLP

(57) ABSTRACT

A variety of leadless packaging arrangements and methods of packaging integrated circuits in leadless packages are disclosed. The described lead frames are generally arranged such that each device area has a plurality of contacts but no die attach pad. With this arrangement, the back surface of the die is exposed and coplanar with the exposed bottom surface of the contacts. A casing material (typically plastic) holds the contacts and die in place. In one aspect of the invention, the back surface of the die is metallized. The metallization forms a good attachment surface for the package and serves as a good thermal path to transfer heat away from the die. In another aspect, at least some of the contacts have a top surface, a shelf, and a bottom surface. The die is wire bonded (or otherwise electrically connected) to the shelf portions of the contacts. The described package is quite versatile. In some embodiments, the top surfaces of the contacts are also left exposed which provides a very low profile device that is particularly well suited for stacking. A stack of LLP devices can thus readily be provided or other devices can be stacked on top of the described devices. In some embodiments, a heat sink may be attached directly to the metallized bottom surface of the die or package. This tends to provide a good thermal path from the die. In another aspect of the invention, a lead frame panel suitable for use in packaging these semiconductor devices is described.

14 Claims, 9 Drawing Sheets

LEADLESS PACKAGE

CROSS REFERENCE TO RELATED APPLICATIONS

This application is related to commonly assigned U.S. Pat. Nos. 6,372,539 and 6,452,255 and U.S. patent application Ser. No. 09/658,166, filed Sep. 8, 2000; and U.S. patent application Ser. No. 10/211,450 filed Aug. 2, 2002, each of which are incorporated herein by reference.

BACKGROUND OF THE INVENTION

The present invention relates generally to the packaging of integrated circuits. More particularly, the invention relates to leadless packaging designs and processes.

A leadless lead frame package (LLP) is an integrated circuit package design that contemplates the use of a lead frame in the formation of a chip scale package (CSP). The resulting packages are sometimes referred to as quad flat packs—no lead (QFN) packages. As illustrated in FIG. 1, in typical leadless lead frame packages, a copper lead frame strip or panel 101 is patterned (typically by stamping or etching) to define a plurality of arrays 103 of chip substrate features 105. Each chip substrate feature 105 includes a die attach pad 107 and a plurality of contacts 109 disposed about their associated die attach pad 107. Very fine tie bars 111 are often used to support the die attach pads 107 and contacts 109.

During assembly, dice are attached to the respective die attach pads and conventional wire bonding is used to electrically couple bond pads on each die to their associated contacts 109 on the lead frame strip 101. After the wire bonding, a plastic cap is molded over the top surface of the each array 103 of wire bonded dice. The dice are then singulated and tested using conventional sawing and testing techniques.

FIG. 2 illustrates a typical resulting leadless lead frame package. The die attach pad 107 supports a die 120 which is electrically connected to its associated contacts 109 by bonding wires 122. A plastic casing 125 encapsulates the die 120 and bonding wires 122 and fills the gaps between the die attach pad 107 and the contacts 109 thereby serving to hold the contacts in place. It should be appreciated that during singulation, the tie bars 111 are cut and therefore the only materials holding the contacts 109 in place is the molding material. The resulting packaged chip can then be surface mounted on a printed circuit board or other substrate using conventional techniques.

Since leadless lead frame packaging have proven to be a cost effective packaging arrangement, there are continuing efforts to provide further improvements to the package structure and/or processing to permit the package style to be used in additional applications and/or to improve specific characteristics of the resultant devices.

SUMMARY OF THE INVENTION

To achieve the foregoing and other objects and according to the purpose of the present invention, a variety of improved packaging arrangements are disclosed. A lead frame is patterned to define at least one array of device areas. Each device area has a plurality of contacts but no die attach pad. With this arrangement, the back surface of the die is exposed and coplanar with the exposed bottom surface of the contacts. A casing (e.g. encapsulating) material (which is typically plastic) holds the contacts and die in place. In one aspect of the invention, the back side of the die is metallized. The metallization forms a good attachment surface for the package and serves as a good thermal path from the die. In another aspect, the at least some of the contacts have a top surface, a shelf, and a bottom surface. The die is wire bonded (or otherwise electrically connected) to the shelf portions of the contacts.

The described package is quite versatile. In some embodiments, the top surfaces of the contacts are also left exposed which provides a very low profile device that is particularly well suited for stacking. A stack of LLP devices can thus readily be provided or other devices can be stacked on top of the described devices. Adjacent packages may be soldered together or otherwise electrically connected in any suitable manner.

In some embodiments, a heat sink is attached directly to the bottom surface of the die or package. This tends to provide a good thermal path from the die. In some embodiments, a recess or step is formed on the lower side of the contacts. This tends to improve the adhesion of the casing to the contacts.

In another aspect of the invention, a lead frame panel suitable for use in packaging these semiconductor devices is described. The lead frame panel includes at least one two dimensional array of the described device areas. A matrix of tie bars is provided that support the conductive contacts. The tie bars are arranged to define the two dimensional array of device areas with only the tie bars separating adjacent device areas within the two dimensional array. During assembly, an adhesive tape is adhered to the bottom surface of the lead frame panel and a plurality of dice are adhered to the adhesive tape. In a preferred embodiment, each die is positioned within an associated device area and electrically connected to the contacts of the associated device area via bonding wires that are wire bonded to the shelves of their associated contacts.

A plastic cap may be provided that covers the dice in an associated two-dimensional area of device areas. The cap encapsulates the bonding wires and provides mechanical support for the dice and the contacts such that when the adhesive tape is removed and the semiconductor devices are singulated, the corresponding plastic cap material holds each die and its associated contacts together leaving the bottom surfaces of the associated contacts and die exposed. In some embodiments, the plastic cap also leaves the top surfaces of the contacts exposed.

In other aspects of the invention, methods for packaging the described devices and for creating the described lead frame panels are disclosed.

BRIEF DESCRIPTION OF THE DRAWINGS

The invention, together with further objects and advantages thereof, may best be understood by reference to the following description taken in conjunction with the accompanying drawings in which.

DETAILED DESCRIPTION OF THE INVENTION

A number of improvements to leadless package designs are described below. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 3:
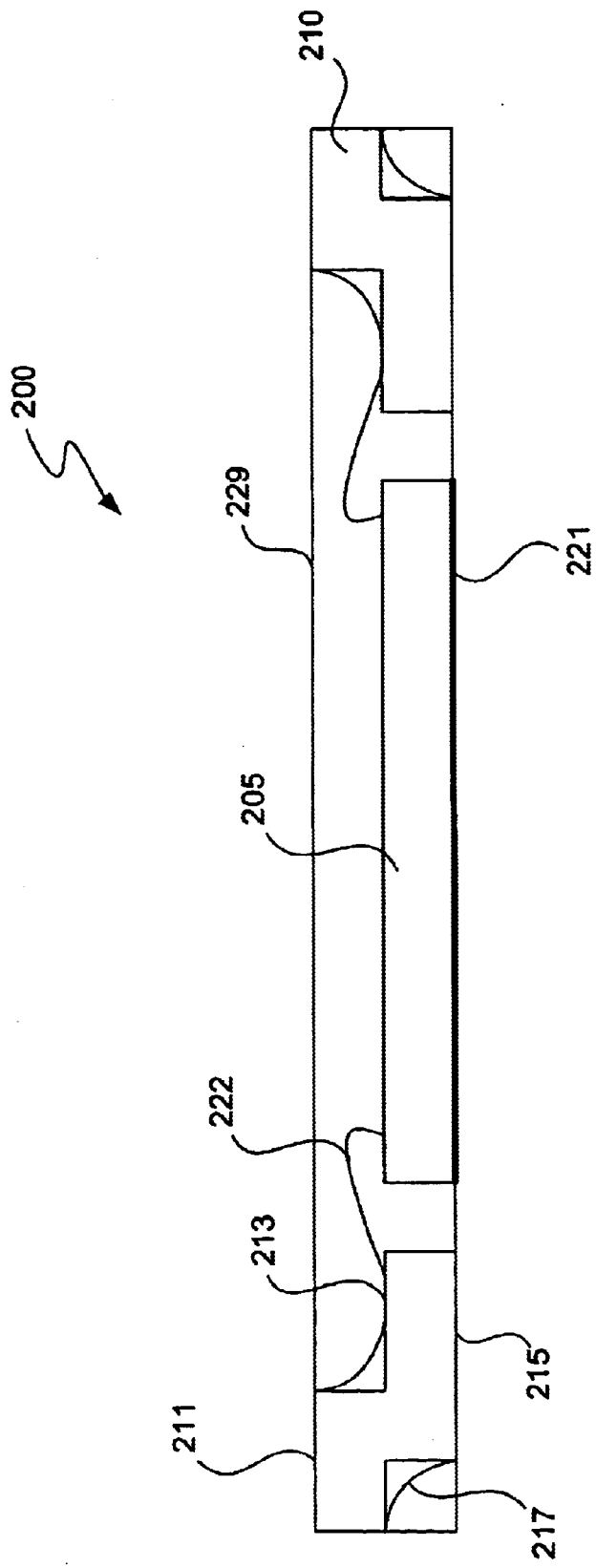
FIG. 3 is a diagrammatic cross sectional side view of a leadless package design in accordance with one embodiment of the present invention.

Referring initially to FIG. 3, a first embodiment of the present invention will be described. As shown therein, the package 200 includes a die 205 and a plurality of contacts 210 that are generally positioned at appropriate locations around the die. The contacts 210 are stepped such that they include a top surface 211, a shelf 213 and a bottom surface 215. Additionally, recesses or under-steps 217 may be formed in the bottom sides of some or all of the contacts 210. The die 205 has a plurality of bond pads that are electrically connected to the shelf portions 213 of associated contacts. In the embodiment shown, bonding wires are used, although it should be appreciated that any suitable technique can be used to electrically couple the die to the contacts 210.

Figure 1A:
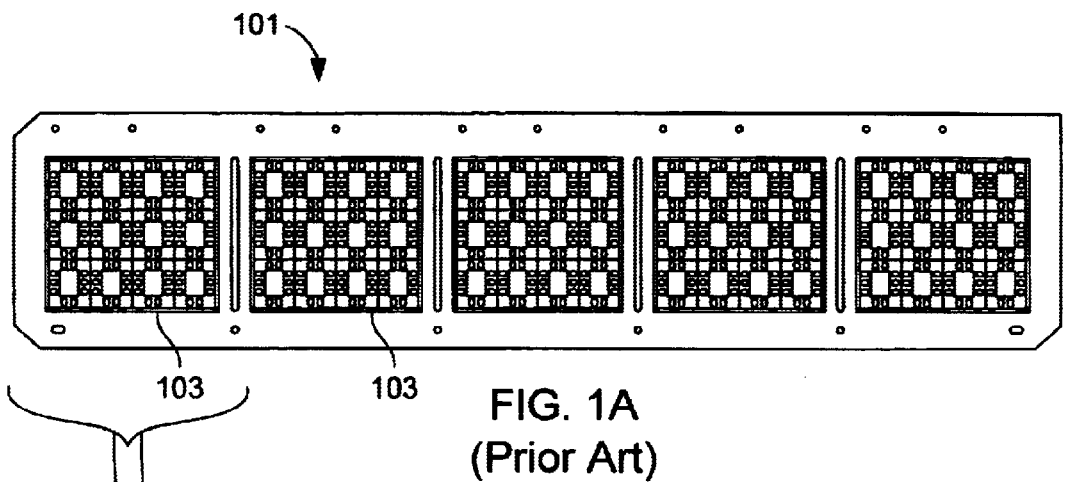
FIGS. 1(a)–1(c) illustrates a lead frame strip of the type that has previously been used to form leadless lead frame packages.
Figure 1B:
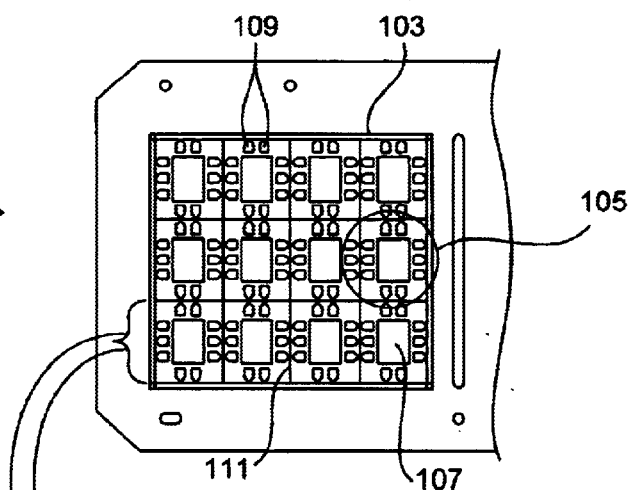
Figure 1C:
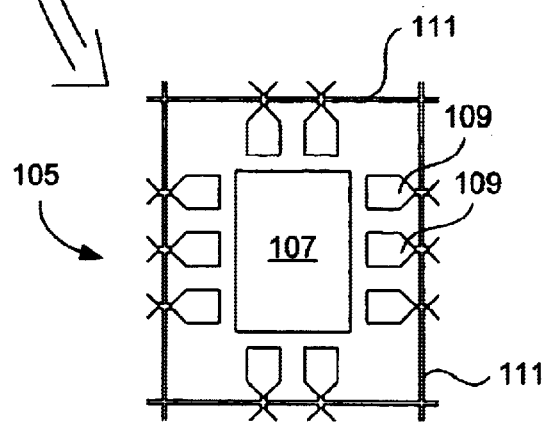
Figure 2:
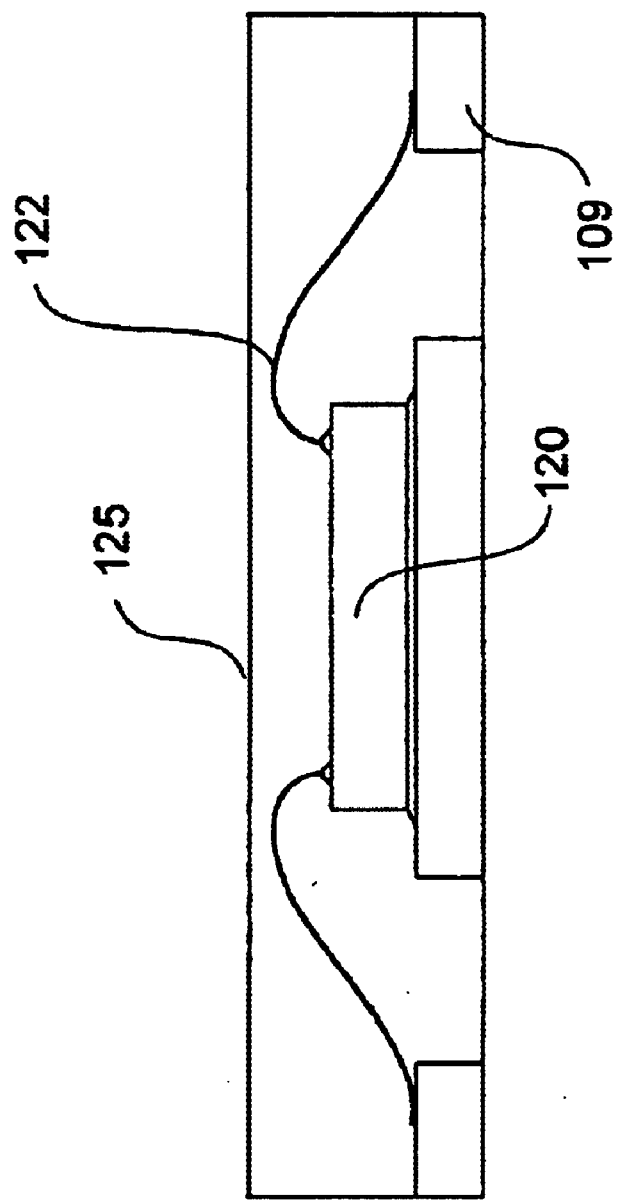
FIG. 2 is a diagrammatic cross sectional side view of a conventional leadless lead frame package.

The top surface of the die 205, the bonding wires 222 and the contact shelves 213 are encapsulated by a casing 229. The casing 229 may be formed in any appropriate manner. The packages are generally formed in panel form on a lead frame panel and the casing 229 may be formed by either individually molding the packages, glop topping or stencil printing type processes or molding a plastic cap over the top surface of an array of wire bonded dice as described above and below. Thus, the leadless package may (but need not) be produced quite similarly to the conventional leadless package illustrated in FIG. 2. However, the die attach pad is eliminated. With this arrangement, the die sits lower in the package and both the overall height of the package and the bonding wires 222 can be shortened accordingly. It should be appreciated that the elimination of the die attach pad allows the die to sit lower in the package, which will tend to reduce the required length of the bonding wire 222. Shortening the bonding wires can provide the added benefit of reducing inductance.

As will be appreciated by those familiar with wire bonding generally, a first end of the bonding wire is typically "ball" bonded to its associated surface (e.g., a bond pad on die 205 in FIG. 3), which forms a ball bond. The second end of the bonding wire is typically attached to a second surface (e.g., the shelf 213 of contact 210 in FIG. 3), using a bond commonly referred to as a "stitch" or "wedge" bond. The bonding wire leaving ball bond tends to rise substantially perpendicularly away from the surface of the die 205, while the bonding wire tends to approach the stitch bond in a manner that is closer to parallel with the surface of contact 210. Thus a "loop" is formed by the bonding wire. As is well known to those skilled in the art, state of the art wire bonding machines permit a great deal of control over the height of the loop. However, the loop generally cannot be eliminated and in small devices, the loop height generally has a significant effect on the overall length of the bonding wires used. Therefore, eliminating the die attach pad has the effect of lowering the bonding wires which permits the reduction of the overall package thickness.

The elimination of the die attach pad has another side benefit of eliminating the risk of delamination of the die from the die attach pad. However, trying to directly attach a die to a printed circuit board or other substrate or even to a heat sink can lead to different delamination issues. In many applications, the delamination risks can be reduced significantly by plating the back surface of the die 205 with a thin metal layer 221 as illustrated in FIG. 3. The metal layer 221 may be formed using any suitable technique. One particularly efficient metal layer formation technique is to deposit the metal layer on the backside of the wafer used to create the dice before singulation (and after any desired backside grinding). By way of example, conventional vapor deposition works well. The metal layer 221 can be formed from any suitable metal. Generally, it is desirable that the metal layer 221 have good soldering characteristics and be compatible with the die. When desired, a multi-layered metal stack may be used. By way of example, multilayered stacks such as Chrome/Silver/Tin (Chrome/Ag/Sn), Titanium/Nickel/Silver (Ti/Ni/Ag) and Nickel/Gold (Ni/Au) stacks work well as the metal layer 221.

Figure 4:
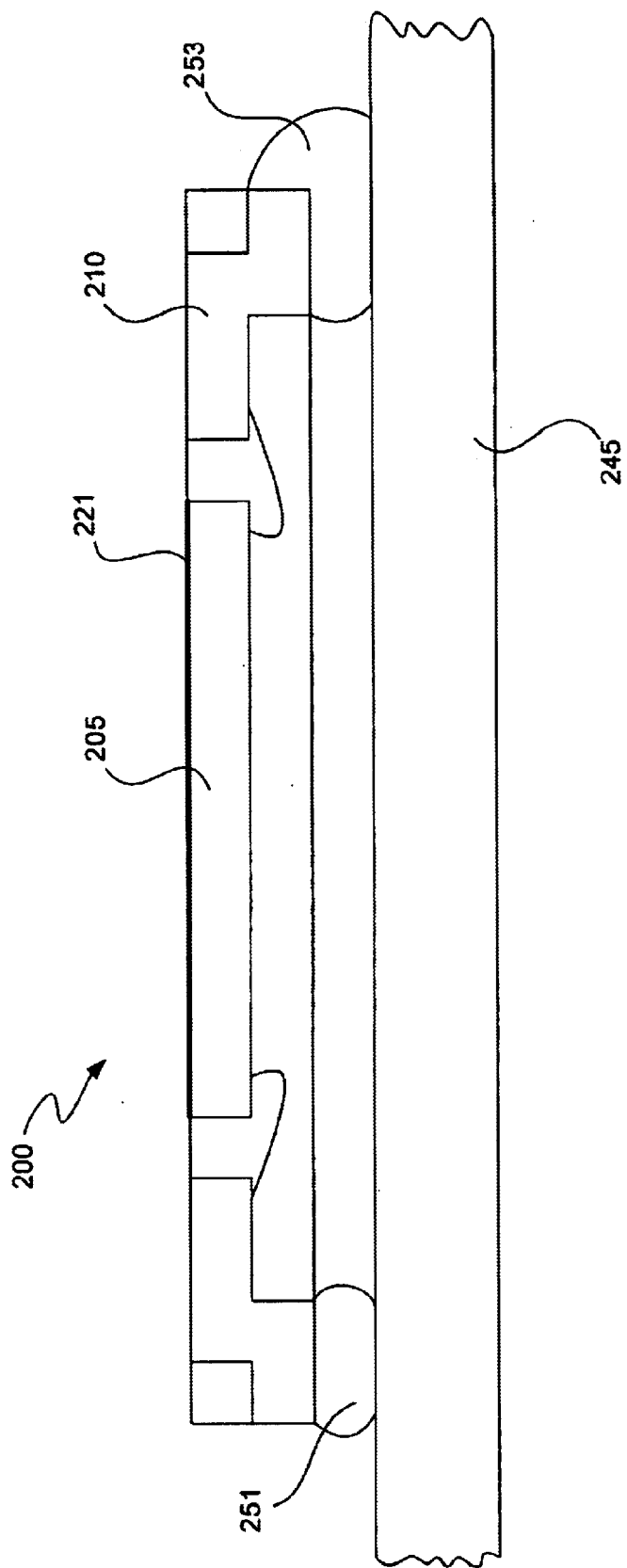
FIG. 4 is cross sectional side view of the leadless package design of FIG. 3 mounted to a printed circuit board in a cavity down configuration.

It should be apparent that the described package structure is quite versatile. The package can be surface mounted on a printed circuit board in a conventional manner in the die facing up (die up) configuration (i.e., in the orientation shown in FIG. 3), with the metal layer 221 and the bottom surfaces 215 of the contacts 210 being soldered to a printed circuit board or other substrate. It should be apparent that in this embodiment, the metal layer provides a good thermally conductive pathway from the die to the substrate. Alternatively, as illustrated in FIG. 4, the package may be surface mounted in a die facing down (die down) configuration by soldering the top surfaces 211 of the contacts 210 to a substrate (e.g., printed circuit board 245). It is noted that since the upper portion of the contact 210 extends to the edge of the package 200, the attachment of the contacts may be done using either normal sized solder joints 251 as diagrammatically illustrated on the left side of FIG. 4, or extra large solder joints 253 as illustrated on the right side of FIG. 4. Of course, an underfill material (not shown) may optionally be used to fill the gap between the package 200 and the printed circuit board 245.

In the preceding (and following) discussions we have sometimes used the terms "top" and "bottom" to refer to one of the surfaces or sides of the die, the package, the contacts or some other component. It should be apparent that these terms are used only in an effort to simplify the explanations and are not necessarily related to physical up or down since the package can be mounted in any orientation. In most instances, the top surface of a die will be a side having bond pads thereon.

Figure 5:
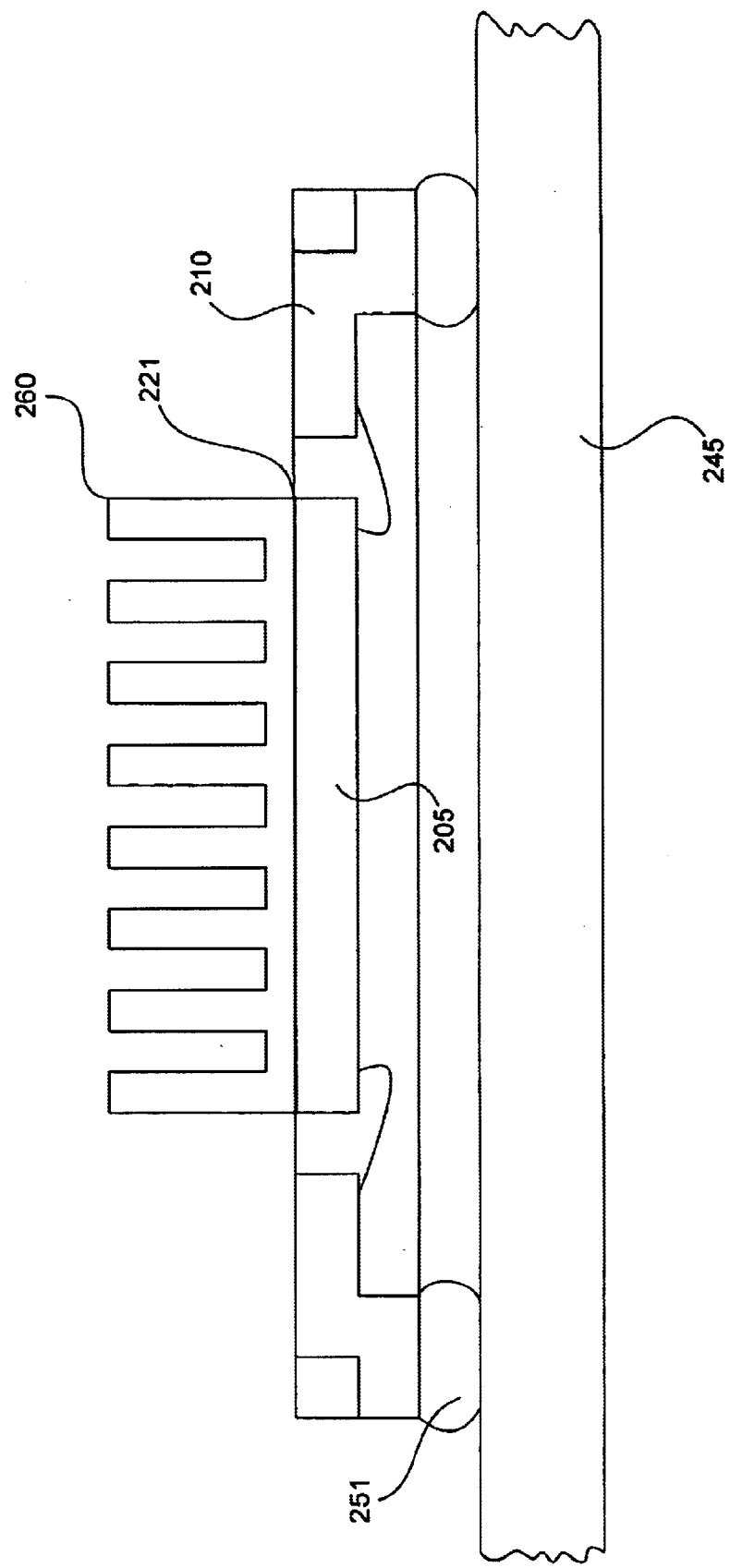
FIG. 5 is a diagrammatic cross sectional side view of a leadless package design in accordance with a second embodiment of the present invention.

It is well know that when a die generates a large amount of heat, it may be desirable to provide a heat sink or a heat spreader to help dissipate excess thermal energy. The die down mounting configuration illustrated in FIG. 4 is quite suitable for use in conjunction with a heat sink 260 as illustrated in FIG. 5. In this embodiment, the heat sink is adhered to the bottom surface (i.e. the exposed surface) of the die. Depending on the application, the heat sink 260 may be attached to the package 200 using any appropriate attachment technique. By way of example, it may be soldered to the metallic back surface of the die 221 or it may be adhesively attached using a thermally conductive epoxy (or other adhesive material) or tape.

Figure 6:
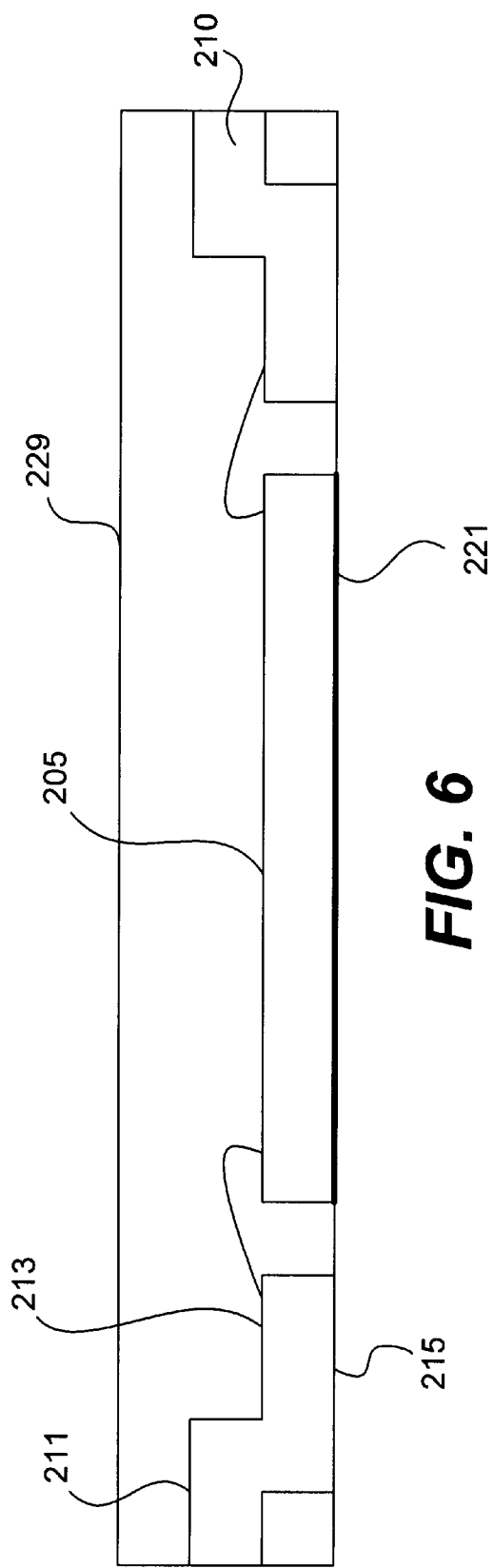
FIG. 6 is a diagrammatic cross sectional side view of the leadless package design of FIG. 4 with a heat sink mounted thereon.

In the previously illustrated embodiments, the package is designed such that the top surfaces of the contacts 210 are exposed along the top surface of the package. However, in other embodiments the top surfaces 211 of the contacts 210 may be buried in the casing as illustrated in FIG. 6. This embodiment does not have the characteristic of having active contacts on the top surface of the die, but it still has a low profile and the die metallization characteristics described above.

Figure 7:
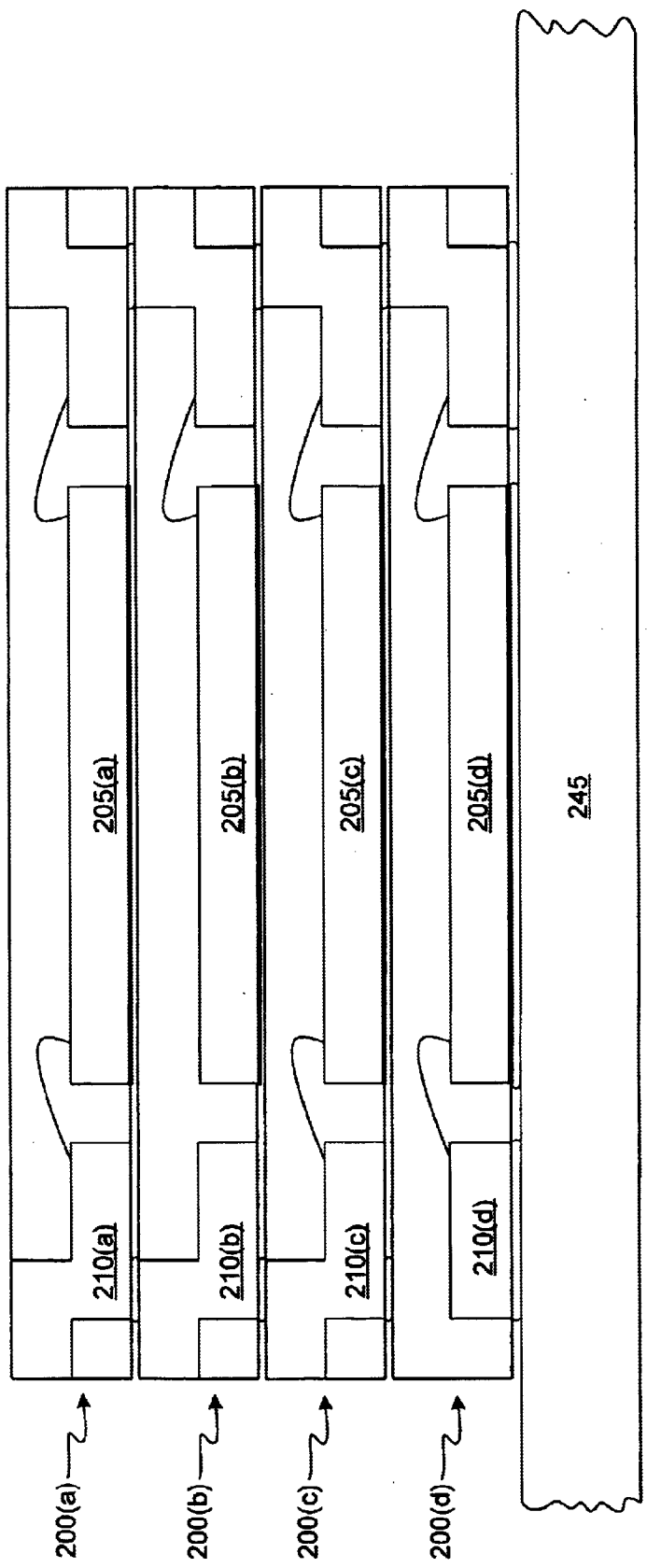
FIG. 7 is a diagrammatic cross sectional side view of a stack of leadless packages in accordance with another embodiment of the invention.

One of the benefits of having contacts exposed on the top surface of the package is that it facilitates direct stacking of two or more of the devices. FIG. 7 diagrammatically illustrates such an arrangement wherein four packages 200(a)–(d), are stacked one on top on another. With this arrangement, a device can be electrically coupled to the package directly above it by soldering a contact from one package directly to a corresponding contact on the adjacent package. In the embodiment illustrated, all of the packages are mounted in the same die up orientation. However, it should be appreciated that the orientation of the packages can be readily changed. By way of example, the packages could all be mounted in a die down orientation, in alternating die up/die down orientations or any other permutation that is suitable for a particular purpose.

It should be apparent that connections between the different devices can be facilitated by the strategic connection, placement and/or formation of the contacts. By way of example, if it is desirable for all of the devices to be electrically coupled to the same pad on the printed circuit board (PCB) 245, then the superimposed contacts are all soldered to their adjacent devices (or PCB pad) and the contacts are also wire bonded to associated bond pads on the dice as illustrated on the right hand side of FIG. 7.

Alternatively, if a particular contact is to be to be electrically coupled on one side but not the other, then that contact can be exposed on just one side by appropriately patterning the contact during etching. An example of this situation is illustrated by the left side contact of package 200(d) in FIG. 7. As can be seen in the drawing, the bottom surface of contact 210(d) is exposed and soldered to an associated pad on the printed circuit board 245. However, the upper portion of the contact has been removed (this can readily be done by etching the entire surface of the contact during the shelf formation etch as opposed to etching only a portion of the contact.) With this arrangement, that particular contact is not electrically connected to the associated contact on the adjacent stacked device. Of course, contacts with just one surface exposed can be used at any location within the stack (e.g., the top, the middle, or the bottom of the stack) to facilitate a particular desired electrical connection scheme.

The contacts can also be arranged to electrically connect two spaced apart components (e.g., the packages 200, the printed circuit board 245, etc.) by simply not wire bonding the die of the intermediate package(s) to the intermediate contact(s). This concept is illustrated by the contacts on the left side of packages 200(a)–(c) in FIG. 7 wherein bond pads on the dice of packages 200(a) and 200(c) are wire bonded to their associated contacts while the die in package 200(b) is not wire bonded (or otherwise electrically connected) to the intermediate contact 210(b). With this arrangement, the contacts 210(a), 210(b) and 210(c) form an electrical path between dice 205(a) and 205(c). Although only a few potential electrical connection schemes have been specifically discussed herein, it should be apparent that the described packages are well suited for stacking devices with a wide range of electrical connection requirements.

Figure 8A:
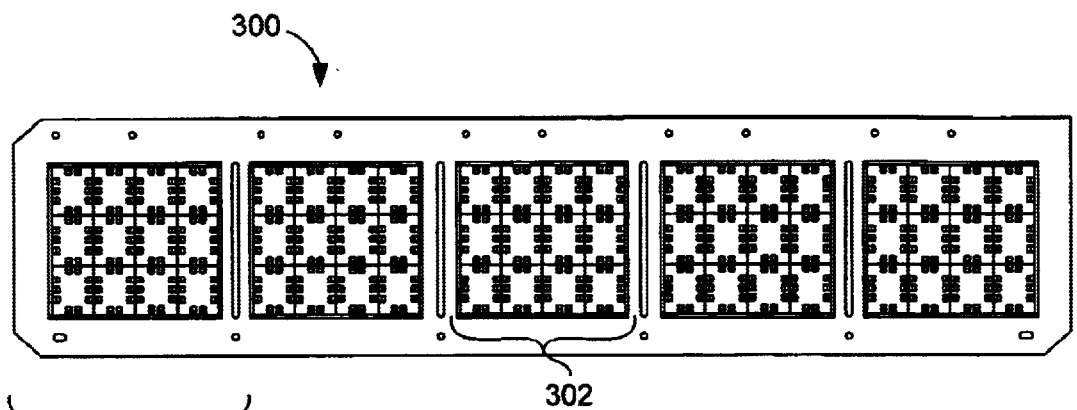
FIGS. 8(a)–8(c) is a diagrammatic top view of a lead frame strip suitable for use in producing the packages illustrated in FIGS. 3–7.
Figure 8B:
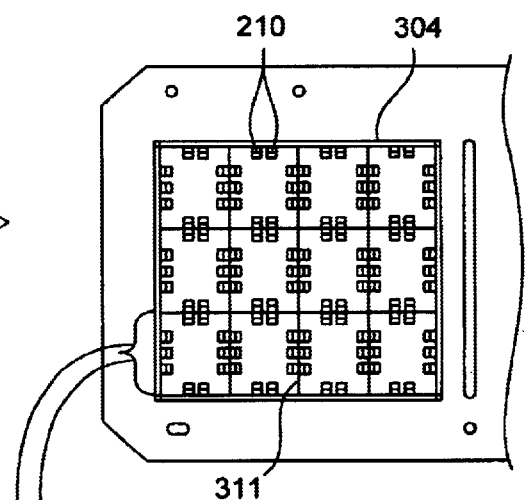
Figure 8C:
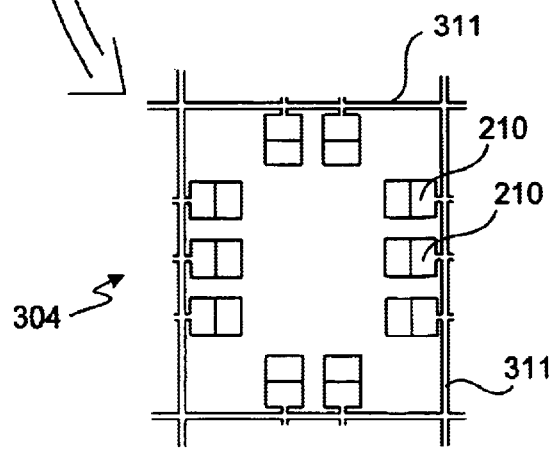

Referring next to FIGS. 8(a)–8(c), a lead frame panel 300 suitable for use in assembling the described packages will be described. The lead frame panel 300 is formed from a conductive material that is suitable for use as the package contacts 210. By way of example copper works well and is the material most commonly used in semiconductor packaging applications. However other materials such as aluminum, other known metals such as Alloy 42, or other conductive materials may be used instead. The lead frame panel 300 may take any appropriate shape or layout. For example, much of the packaging handling equipment that is available is designed for handling lead frame strips and therefore, lead frame strips such as the strip illustrated in FIG. 8(a) may be used as the lead frame panel. Alternatively, in many respects wider panels may be desirable since they will typically have better rigidity and facilitate better space utilization. The panels may thus take any shape, although substantially square or rectangular panels are expected to be the most common.

Lead frame processing is well known to those skilled in the art. Generally, stamping and etching are the most common processes for patterning a lead frame. The lead frames illustrated in FIGS. 3–8 have features formed on both sides of the panel (e.g. the shelves 215 and the under-steps 217). One way to form these features is to thin the corresponding regions of the lead frame. The thinning can be accomplished using a variety of conventional etching techniques. In one specific example a photo-lithographic based etch process is used. However, it should be apparent that the techniques, chemistries and or processes used to etch (or grind or otherwise form) the recesses can be widely varied within the scope of the present invention. It should be apparent that the illustrated lead frames require thinning both sides of the lead frame panel. However, if the under-steps 217 are eliminated, only one side of the lead frame would need to be thinned. After the thinned regions have been formed, the remainder of the lead frame panel may be fully patterned to form one or more arrays 302 of device areas 304 as best illustrated in FIGS. 8(b) and 8(c). The patterning defines the contacts 210, as well as the tie bars 311 that support the contacts during processing. The final patterning may be accomplished by stamping. Alternative the entire patterning may be accomplished by etching that occurs simultaneously with, or separately from the thinning.

In the embodiment illustrated in FIG. 8, five arrays 302 are illustrated in a lead frame strip 300. It should be appreciated that the number of arrays provided in any particular substrate panel and the number of device areas in each array may be very widely varied in accordance with the needs, constraints and optimizations of the particular manufacturing process. By way of example, arrays having from 3 to 20 devices on each side are commonly used, although larger arrays are possible and it is suspected that as technology develops, higher and higher densities having 50 or more devices on a side will be used.

Each device area 304 (illustrated in FIG. 8(c)) has the appropriate contact features formed thereon. As discussed above, in some situations (as for example when stacking in contemplated) it may be desirable to alter the shapes of at least some of the contacts within the device areas. After the substrate panel 200 has been patterned, it may optionally be plated with a material (not shown) that facilitates better wire bonding as. In the described embodiment, the contacts 210 (or at least the shelf portions thereof) are selectively silver plated since as is well known to those skilled in the art, the gold bonding wires bond better with the silver plating than a copper substrate. In other embodiments alternative materials such as nickel-palladium (NiPd) or NiPdAu may be plated onto the contact pads to facilitate bonding. Of course, the actual plating materials used may be widely varied and a number of suitable materials are commercially available.

Figure 9:
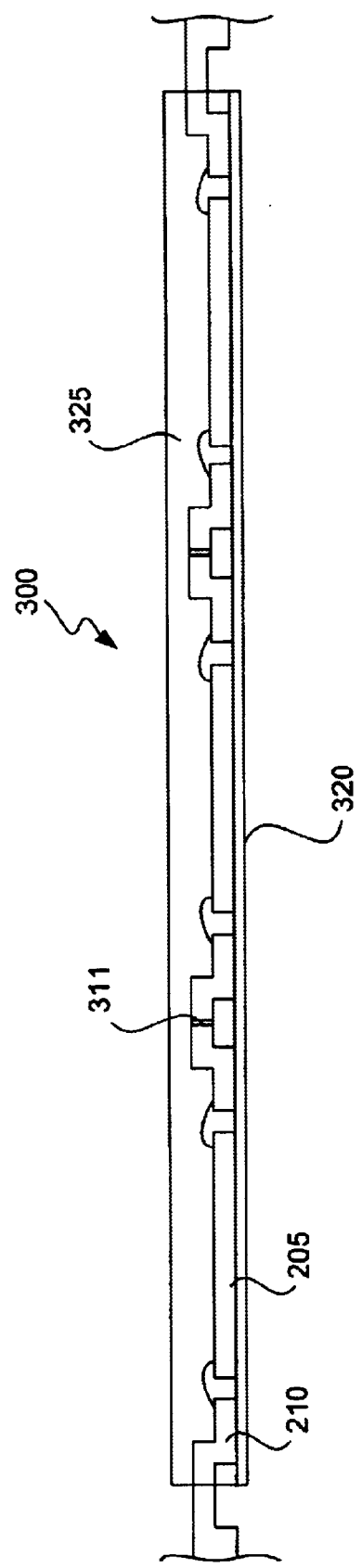
FIG. 9 is a diagrammatic side view of the lead frame strip of FIG. 8(a).

The described lead frame may then be used to package several arrays of integrated circuits in parallel. An adhesive tape 320 is adhered to the bottom surface of the lead frame as best illustrated in FIG. 9. This approach is generally described in U.S. patent application Ser. No. 09/528,539, (now abandoned), which is incorporated herein by reference. The tape is adhered after the substrate has been patterned and helps support the contacts 210. Dice 205 are then mounted directly on the adhesive tape 320. Thereafter bond pads on the dice 205 are electrically connected to associated ones of the contact shelves 213. In the embodiment shown, wire bonding is used to electrically connect the dice to their associated contact landings. Therefore, the tape 320 serves as the support for the die during wire bonding and other subsequent handling.

As suggested above, bonding wires are typically formed from gold. When gold bonding wires 222 are used in combination with a copper substrate, it is advantageous to silver (or otherwise) plate to contact shelves 213 to improve the adhesion of the bonding wires to the landings. As is well known to those skilled in the art, for a number of reasons, during wire bonding, it is traditional to ball bond to the bond pads on the die and stitch bond to the leads or substrate (such as the contacts 210). One of the reasons for this is that the stitch bonds are less constrained and there is a greater risk of damaging the die. It is contemplated that in most cases, traditional wire bonding will be used. However, in some applications, the top surface of the die 205 will be higher than the shelf 213 in these situations, it may be desirable to use a reverse wire bonding process.

After all of the dice have been wire bonded or otherwise electrically connected to the appropriate contact landings, the bonding wires and dice are encapsulated thereby forming the casing 229. As suggested earlier, a wide variety of techniques can be used to for the casing. By way of example, molding, stencil printing and glob topping type processes may all be used. In the illustrated embodiment, plastic caps 325 are molded over each array in the substrate panel 200. The plastic caps 325 encapsulate the dice 205 and bonding wires 222 and fill the gaps between the contacts 210 thereby serving to hold the contacts in place. During subsequent singulation, the tie bars 311 are cut and therefore the only materials holding the contacts 210 in place will be the molding material.

In the described embodiment, a separate plastic cap is formed over each separate array or matrix 302 of device areas 304. In the embodiment illustrated in FIG. 8(a), that would include five separate caps each covering one of the arrays 302. However, it should be appreciated that a single cap or a different number of caps can readily be provided. As will be appreciated by those skilled in the art, one potential disadvantage to having a single very large cap 325 that covers a large array on a single large panel is that the cap may induce stresses which adversely affect the dice. Thus, when molding over large panels it is common to logically separate the panel into a plurality of regions (e.g. the separate arrays) in order to reduce the impact of such induced stresses. However, it should be apparent that when the component design parameters and molding process control permits, a single cap may be provided.

In other embodiments, a relatively larger number of caps 325 may be molded over the surface of the substrate panel. One drawback of having too many caps is that in order to form separate caps, a greater spacing is required between adjacent device areas 304 that are under different caps than would be required for adjacent device areas 304 under the same cap. Thus, the density of devices that can be packaged on a particular substrate panel is reduced. In some embodiments, the device areas may be individually molded or encapsulated, although it should be appreciated that this arrangement generally requires the use of a lower device density on the lead frame than the illustrated embodiment since room must be left between adjacent device areas for the mold to seat. This alternative embodiment does, however permit the leads to extend beyond the edge of the molding material that forms casing 229.

The caps 325 may be formed using any conventional molding process including transfer molding and injection molding. In the described embodiment, a molded array type transfer molding process is used. Alternatively, glob topping, screen or stencil printing or other suitable encapsulations processes may be used to form the caps. After the caps 325 have been formed, any additional process steps that are desired may be performed. As will be appreciated by those skilled in the art, these may include solder plating the exposed surfaces of the contacts 210 and singulating the packaged integrated circuits. The resulting packaged chips can then be surface mounted on printed circuit boards or other appropriate substrates and/or devices using conventional techniques.

It should be apparent that during the encapsulation process, the encapsulant material flows around the contacts 210 and the die 205 such that it fills any gaps therebetween. When the encapsulant sets to become the casing 229, it serves as the mechanism that mechanically holds the contacts and die in place relative to one another. Since the casing 229 does not surround the contacts or the die (i.e., the back surface of the die and the bottom surface of the contacts are exposed) the understeps 217 serve as locks that help hold the contacts in place.

Although only a few embodiments of the invention have been described in detail, it should be understood that the present invention may be embodied in many other specific forms without departing from the spirit or scope of the invention. As suggested, a variety of different conductive materials may be used as the lead frame. The thickness of the leadframe may be widely varied. By way of example, lead frame thicknesses on the order of 6 to 8 mils work well with existing processing equipment. In one particular embodiment, an 8 mil lead frame is used. It should be apparent that the use of such thin lead frames permit the formation of very thin packages. However, it should be appreciated that the thickness can be widely varied and it is expected that both thinner and thicker lead frames will eventually be used in this application.

A number of conventional package processing techniques have been described as being used to accomplish specific steps in the formation of the described devices. It should be apparent that in most cases these processing techniques can be widely varied and a wide variety of alternative conventional processes may be used in their place. Accordingly, the present examples are to be considered as illustrative and not restrictive, and the invention is not to be limited to the details given herein, but may be modified within the scope of the appended claims.

What is claimed is:

1. A semiconductor package comprising:
   a lead frame including a plurality of conductive contacts, wherein at least some of the conductive contacts have a top surface, a top facing shelf and a bottom surface;
   a die having top and bottom die surfaces, the die including a plurality of bond pads disposed on the top die surface and a metallic layer disposed on the bottom die surface, and wherein the bottom surfaces of the conductive contacts are substantially co-planar with the bottom die surface;
   connectors for electrically connecting selected bond pads to associated contacts, wherein the connectors are attached to the top facing shelves of the contacts; and
   a casing formed over the top die surface and the shelf portions of the contacts thereby encapsulating the connectors while leaving the bottom surfaces of the contacts and die exposed at a bottom surface of the package, wherein material that forms the casing is also exposed on the bottom surface of the package substantially co-planer with the bottom surfaces of the contacts to isolate the contacts.

2. A semiconductor package as recited in claim 1 wherein the top surfaces of the contacts are exposed on the top surface of the package.

3. A stack of semiconductor devices comprising a plurality of semiconductor packages as recited in claim 2 mounted on top of one another to form a stack, wherein at least some of the contacts from adjacent semiconductor packages in the stack are soldered together.

4. A semiconductor package as recited in claim 1 further comprising a heat sink attached directly to the bottom surface of the package by an electrically insulative material.

5. A semiconductor package comprising:
   a lead frame including a plurality of conductive contacts, wherein at least some of the conductive contacts have a top surface, a top facing shelf and a bottom surface;
   a die having top and bottom die surfaces, the die including a plurality of bond pads disposed on the top die surface, and wherein the bottom surfaces of the conductive contacts are substantially co-planar with the bottom die surface;
   a plurality of bonding wires for electrically connecting selected bond pads to associated contacts, wherein the bonding wires are attached to the top facing shelves of the contacts; and
   a casing formed over the top die surface and the shelf portions of the contacts thereby encapsulating the bonding wires while leaving the bottom surfaces of the contacts and die exposed at a bottom surface of the package and leaving the top surfaces of the contacts exposed at the top surface of the package, wherein material that forms the casing is also exposed on the bottom surface of the package substantially co-planer with the bottom surfaces of the contacts to isolate the contacts.

6. A stack of semiconductor devices comprising a plurality of semiconductor packages as recited in claim 5 mounted on top of one another to form a stack, wherein at least some of the contacts from adjacent semiconductor packages in the stack are soldered together.

7. A semiconductor package as recited in claim 5 wherein at least some of the conductive contacts include an under-step.

8. A lead frame panel suitable for use in packaging semiconductor devices, the lead frame panel being formed from a conductive sheet and having top and bottom surfaces:
   at least one two dimensional array of device areas, each device area including a multiplicity of conductive contacts and not including a die attach pad, each conductive contact including a top surface, a top facing shelf suitable for wire bonding, and a bottom surface; and
   a matrix of tie bars that support the conductive contacts, the tie bars being arranged to define the two dimensional array of device areas and wherein only the tie bars separate adjacent device areas within the two dimensional array.

9. A lead frame panel as recited in claim 8 wherein at least some of the conductive contacts include an under-step.

10. A panel for use in packaging semiconductor devices, the panel comprising:
    a lead frame panel as recited in claim 8;
    an adhesive tape adhered to the bottom surface of the lead frame panel;
    a plurality of dice adhered to the adhesive tape, each die being positioned within an associated device area and electrically connected to the contacts of the associated device area via bonding wires that are wire bonded to the shelves of their associated contacts.

11. A panel as recited in claim 10 further comprising a plastic cap that covers the dice in an associated two dimensional area of device areas, thereby encapsulating the bonding wires and providing mechanical support for the dice and the contacts such that when the adhesive tape is removed and the semiconductor devices are singulated, the corresponding plastic cap material holds each die and its associated contacts together leaving the bottom surfaces of the associated contacts and die exposed.

12. A panel as recited in claim 11 wherein the plastic cap also leaves the top surfaces of the contacts exposed.

13. A method of packaging semiconductor devices comprising:
    providing a lead frame panel patterned to define at least one two dimensional array of device areas, each device area including a multiplicity of conductive contacts and not including a die attach pad, each conductive contact including a top surface, a top facing shelf suitable for wire bonding, a bottom surface and a bottom facing shelf;
    adhering an adhesive tape to the bottom surface of the lead frame panel;
    mounting a plurality of dice on the adhesive tape, each die being positioned within an associated device area;
    electrically connecting each die to the contacts of its associated device area via bonding wires that are wire bonded to the top shelves of their associated contacts;
    forming a cap over an associated two dimensional area of device areas, thereby encapsulating the bonding wires and providing mechanical support for the dice and the contacts in the associated two dimensional array such that when the adhesive tape is removed and the semiconductor devices are singulated, the corresponding plastic cap material holds each die and its associated contacts together leaving the bottom surfaces of the associated contacts and die exposed.

14. A method as recited in claim 13 wherein the plastic cap is formed such that it also leaves the top surfaces of the contacts exposed.

* * * * *